US012618923B2

(12) United States Patent
Numan et al.

(10) Patent No.: US 12,618,923 B2
(45) Date of Patent: May 5, 2026

(54) RADIO FREQUENCY COIL WITH T-SHAPED CONNECTOR BETWEEN ELECTRICAL CONDUCTORS AND RADIO FREQUENCY SHIELD

(71) Applicant: KONINKLIJKE PHILIPS N.V., Eindhoven (NL)

(72) Inventors: Wouter Carel Marinus Numan, Best (NL); Eerke Holle, Westerhoven (NL); Aleksei Dubok, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 175 days.

(21) Appl. No.: 18/276,312

(22) PCT Filed: Feb. 25, 2022

(86) PCT No.: PCT/EP2022/054757
§ 371 (c)(1),
(2) Date: Aug. 8, 2023

(87) PCT Pub. No.: WO2022/184564
PCT Pub. Date: Sep. 9, 2022

(65) Prior Publication Data
US 2024/0103104 A1      Mar. 28, 2024

(30) Foreign Application Priority Data

Mar. 4, 2021    (EP) ..................................... 21160678
Aug. 9, 2021    (EP) ..................................... 21190253

(51) Int. Cl.
*G01R 33/34*      (2006.01)
*G01R 33/421*      (2006.01)

(52) U.S. Cl.
CPC . *G01R 33/34076* (2013.01); *G01R 33/34007* (2013.01); *G01R 33/4215* (2013.01)

(58) Field of Classification Search
CPC ........ G01R 33/34076; G01R 33/34007; G01R 33/4215; G01R 33/422; G01R 33/421
See application file for complete search history.

(56) References Cited

U.S. PATENT DOCUMENTS

| 4,506,224 A | 3/1985 | Krause |
| 4,642,569 A | 2/1987 | Hayes et al. |
| 5,243,286 A | 9/1993 | Rzedzian et al. |
| 6,420,871 B1 * | 7/2002 | Wong ............... G01R 33/34046 |
| | | 324/318 |

(Continued)

FOREIGN PATENT DOCUMENTS

| WO | 2005124379 A1 | 12/2005 |
| WO | 2009050650 A1 | 4/2009 |

OTHER PUBLICATIONS

International Search Report and Written Opinion from PCT/EP2022/054757 mailed Jun. 30, 2022.

(Continued)

*Primary Examiner* — G.M. A Hyder

(57) ABSTRACT

A radio frequency (RF) coil comprises a lay-out of electrical conductors including several axial rung 11s and several circumferential rings (12), in which at least one of the rung 11s is coupled with at least one of the rings by a T-shaped connector. The T-shaped connector includes a distributed capacitive coupling between the ring (12) and the rung (11).

13 Claims, 7 Drawing Sheets cross section side view                    front view

(56)            References Cited

U.S. PATENT DOCUMENTS

| | | | |
|---|---|---|---|
| 7,859,264 B2 | 12/2010 | Wosik et al. | |
| 8,680,863 B1 | 3/2014 | Qian et al. | |
| 2002/0158720 A1* | 10/2002 | Weyers | G01R 33/34046 |
| | | | 333/219 |
| 2011/0124507 A1* | 5/2011 | Wosik | G01R 33/34046 |
| | | | 324/318 |
| 2012/0153955 A1 | 6/2012 | Wong | |
| 2019/0079153 A1 | 3/2019 | Eberler et al. | |
| 2019/0317164 A1 | 10/2019 | Leussler et al. | |
| 2019/0317166 A1 | 10/2019 | Imai et al. | |

OTHER PUBLICATIONS

Boskamp et al Low Eddy Current RF Body Coils Proceedings of the Int. Soc. for Magnetic Reson. in Med. 17 (2009) Apr. 18, 2009 p. 4747.

* cited by examiner

60

61

700mm

60

62

700mm

60

67

63

67

RADIO FREQUENCY COIL WITH T-SHAPED CONNECTOR BETWEEN ELECTRICAL CONDUCTORS AND RADIO FREQUENCY SHIELD

CROSS REFERENCE TO RELATED APPLICATIONS

This application is a U.S. national phase application of International Application No. PCT/EP2022/054757 filed Feb. 25, 2022, which claims the benefit of EP Application Serial No. 21160678.5 filed on Mar. 4, 2021 and EP Application Serial No. 21190253.1 filed on Aug. 9, 2021, each of which is incorporated herein by reference.

FIELD OF THE INVENTION

The invention pertains to a radio frequency (RF) coil comprising a lay-out of electrical conductors including several axial rungs and several circumferential rings coupled by a T-shaped connector.

BACKGROUND OF THE INVENTION

Such an RF coil is known form the US-patent application US2009/0219026.

The known RF coil is a birdcage type multi-channel transmit/receive RF coil and has a set of coil units forming a cylindrical shape having a circumference and opposite ends. The coil units are connected in succession along circumferential direction of the cylindrical shape at the respective opposite ends of the cylindrical shape. Each coil unit comprises at least one capacitor. The capacitance value of the capacitor in each coil unit is selected primarily to achieve primary mode coil RF resonance at the desired frequency. The capacitors are respectively connected in the coil units at an edge of one end face of the cylindrical shape.

SUMMARY OF THE INVENTION

An object of the present invention is to provide an RF coil, in particular for a magnetic resonance examination system that has improved electromagnetic properties.

This object is achieved by the RF coil as defined in Claim 1. An insight of the present invention is that the distributed capacitive coupling in the T-shaped connector where rings and rungs meet each other forms a parallel circuit capacitor array. This achieves multiple independent electrical current paths of similar impedance which distributes electrical current so as to reduce the proximity effect, lowers local RF heating and suppresses eddy current generation due to gradient switching in the magnetic resonance examination system. The configuration of the distributed capacitive coupling further has larger impedance transitions predominantly concentrated radially and between the capacitor plates, so that electrical field fanning into the magnetic resonance examination system's examination region (i.e. towards the patient to be examined) is reduced. Moreover, the RF coil of the invention is simpler and less expensive to manufacture, notably because there is no need to mount a large number of lumped capacitors. The invention achieves improved electromagnetic properties notably in that the RF coil has improved gradient field decoupling and RF performance. The invention may be employed in a magnetic resonance examination system comprising an RF transmit antenna to generate RF fields in the examination zone and a gradient system to generate gradient magnetic field pulses. The RF fields and the gradient magnetic fields manipulate nuclear spins so as the generated magnetic resonance signals that are encode for particular contrast and spatial resolution. When employed in an magnetic resonance examination system the invention provides for a T-section with low gradient coupling in particular for laminate RF coils.

It is noted that in the framework of this application the term T-shape encompassed any geometrical arrangement in which electrical conductors meet from different directions, often at right angles, but other transverse orientations may be employed. Thus, the T-shape may be straight or skewed and may or may not be part of a more elaborate geometric combination of conductors, such as in the shape of a +-sign or X-sign that can be regarded of a combination of several (two) strict T-shapes.

An insight of the present invention is that in order to achieve better capacitive coupling without the use of discrete capacitive elements, the conductive overlapping were to be increased, while on the other hand larger overlapping conductive area have increased susceptibility for eddy currents. According to the invention, overlapping areas of structured separate galvanically isolated conductors of both the ring and rung achieve both improved capacitive coupling and reduced eddy current susceptibility and hence less heat generation.

The invention may be applied in RF receiver coils for receiving (RF) magnetic resonance signals, as well as in RF transmit coils that generate RF ($B_1^+$)-fields and also in RF transmit-/receive coils that can operate in a transmit mode and in a receive mode.

These and other aspects of the invention will be further elaborated with reference to the embodiments defined in the dependent Claims.

In a preferred embodiment of the RF coil of the invention, the rung and the ring have respective sets of axially and circumferentially overlapping axial and circumferential electrical conducting segments that form the T-shaped conductor and that are galvanically insulated from one another and the distributed capacitive coupling is formed by the overlapping regions of the sets of electrical conducting segments. The axial and circumferentially conducting segments are radially separated, e.g. by a layer of dielectric material between them. In this embodiment the distributed capacitive coupling in the T-shaped connector forming the parallel circuit capacitor array is achieved in a simple manner by the overlapping electrical conducting segments that are for example separated by the dielectric layer. The axial direction is along the RF coil's longitudinal axis. The circumferential direction is circumferential around the longitudinal axis. The longitudinal and circumferential direction corresponds to the RF-coils cylindrical geometry that makes up the RF-coils volumetric resonator In another example, the axial set and the circumferential set may include a plurality of elongate electrical conductors that are orientated in the circumferential and axial directions, respectively. This arrangement has good radio frequency properties, while eddy currents, e.g. due to gradient switching are suppressed.

In a further example, the T-shaped connector has a printed-circuit board substrate and the axial and circumferential electrical conducting segments are disposed on opposite surfaces of the printed-circuit board substrate. Making use of well controlled PCB-technology achieves simple, accurate and inexpensive manufacture of the RF coil of the invention.

In a further example, the axial and circumferential electrical conducting segments are sets of respective slitted flat elongate conductor strips orientated in the circumferential and axial directions, respectively. These slitted strips effectively suppress generation of eddy currents. Good results for both suppressing eddy currents as well as avoiding disturbances of the RF field pattern are achieved for an example in which optimum results or achieved using segments of which the smallest linear dimension does not exceed 20 mm and segments are not more than 1 mm apart. However, adequate technical effects are not limited to this actual example.

The sets of axial and circumferential electrical conducting segments may be integral with the ring and rung, respectively, forming the T-shaped connector that connects the ring and the rung. This allows easy and accurate build-up of the RF coil of the invention.

In a practical implementation, the RF coil of the invention comprises several, e.g. two, three or more axially separated circumferential rings orientated normal to the longitudinal axis of the coil and that are coupled by plurality of six, twelve or more rungs that extend axially. Individual pairs of a ring and a rung are coupled by a T-shaped connector that includes a distributed capacitive coupling between the ring and the rung.

The invention further relates to a radio frequency (RF) screen for surrounding a RF coil. The RF screen of the invention is defined in claim 8. The RF screen of the invention is based on the sets of overlapping axial and circumferential electrical conducting segments that form the T-shaped conductor and that are galvanically insulated from one another and the distributed capacitive coupling formed by the overlapping regions of the sets of electrical conducting segments. The RF screen counteracts the RF field to extend (radially) outside of the RF coil. The impedances of the distributed capacitive couplings are adjusted to that the RF screen remains substantially transparent for gradient magnetic field pulses. Accordingly, the RF screen of the invention may be radially positioned in a magnetic resonance examination system between the gradient coil and the RF coil, so that the RF coil can be positioned relatively close to the examination zone. Thus the RF coil can operate efficiently in both transmit and receive mode. The RF screen may be employed in combination with the RF coil of the invention, or in combination with a conventional RF coil.

These and other aspects of the invention will be elucidated with reference to the embodiments described hereinafter and with reference to the accompanying drawing wherein

DETAILED DESCRIPTION OF THE EMBODIMENTS

Figure 1:
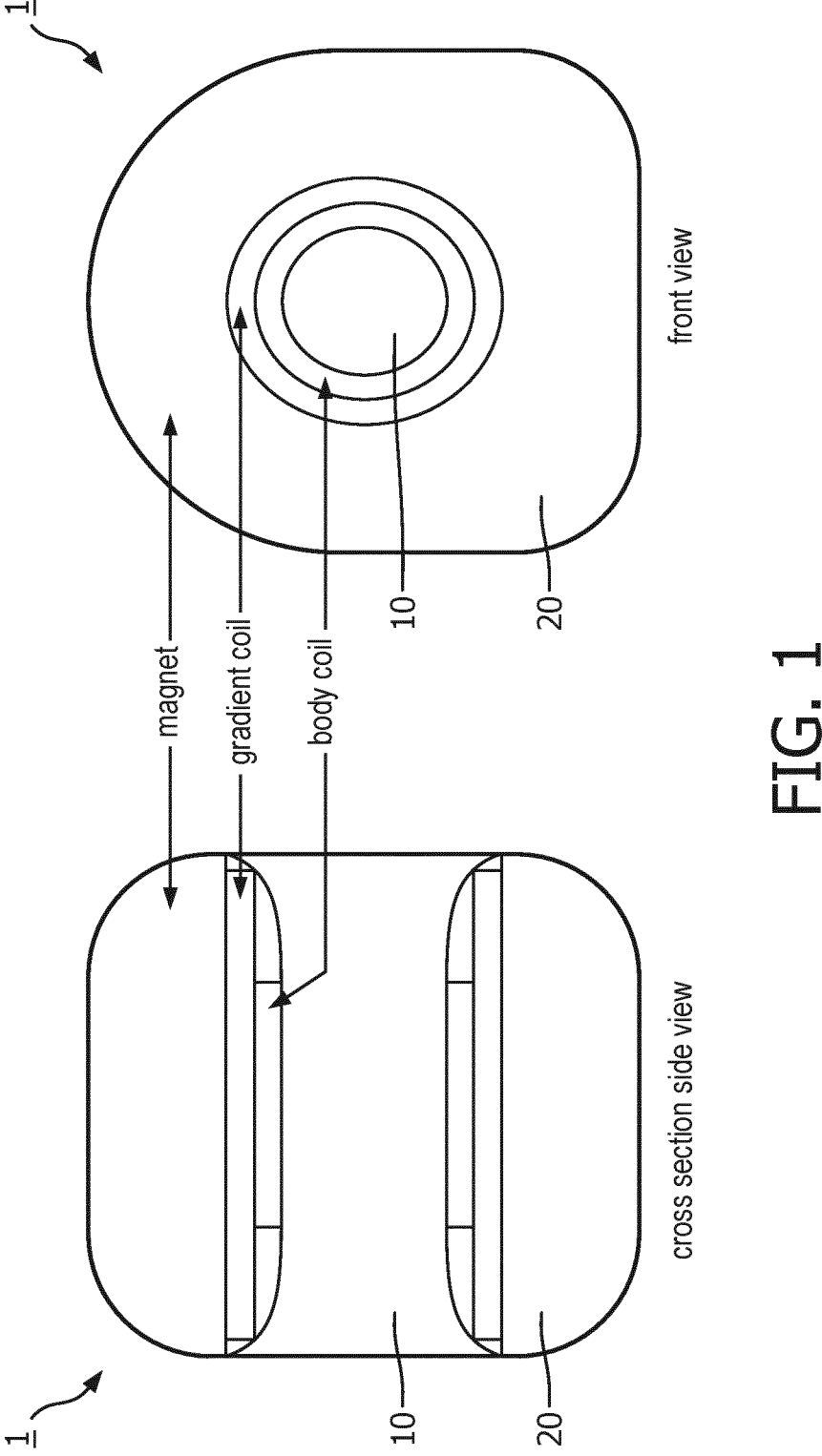
FIG. 1 shows a diagram of an MRI system showing the location of the gradient and body coils.

FIG. 1 shows a diagram of an MRI system 1 showing the location of the gradient coils 20 and RF body coil 10.

An MRI scanner of this example of three cylindrical concentric subsystems: the static magnet, the gradient coils 20 and the quadrature body coil 10, surrounding the patient bore (FIG. 1). Gradient coils create a gradient in the static magnetic field, used in image signal localization, which pulses with a frequency in the kHz range. Between the gradient coils and the patient bore the quadrature body coil is located, which transmits and receives RF-field pulses in the MHz range, used for image acquisition.

A typical body coil design is the birdcage, which comprises of a number of conductive rods, also known as rungs 11, along the central axis of the patient bore, connected on both ends to each other by two large rings 12. To have the birdcage coil resonate and deliver RF field to the patient at the optimal frequency, usually capacitors divide sections of the ring 12, rung 11 or both. Modern implementations of the body coil typically have the conductive rings and rung 11s printed out on a large PCB. This PCB folds into a cylindrical shape and connects at the edges to form a birdcage.

The type of capacitors used in a birdcage coil were typically discrete electronic components soldered on to the body coil, but recent designs integrate the capacitor function into a larger multi-layer PCB layout. The advantage of integrated capacitors being the loss of the need for soldering and associated benefits regarding manufacturing and reliability, but at a cost of size and range of capacitance.

Figure 2:
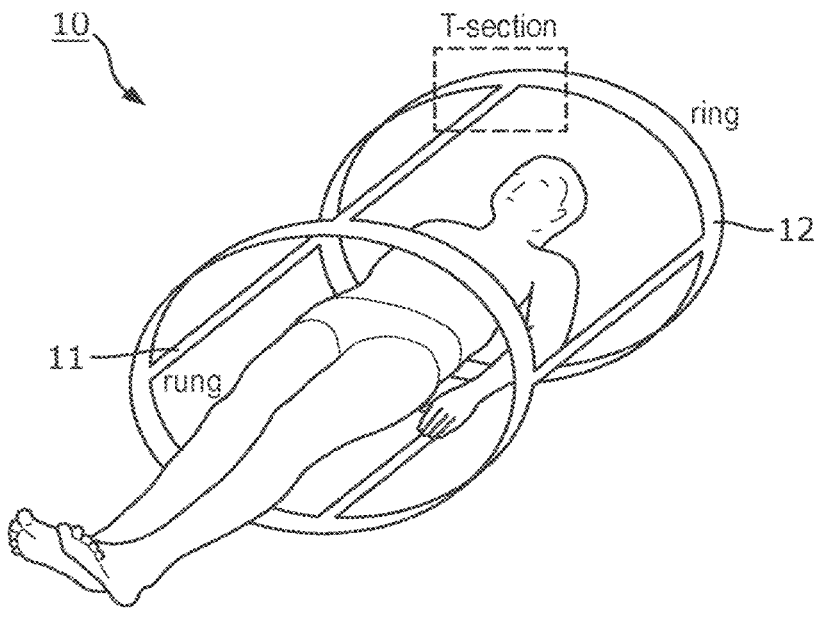
FIG. 2 shows T-section on a four-rung birdcage body coil of the invention.

FIG. 2 shows T-section 13 on a four-rung 11 birdcage body coil of the invention. The birdcage configuration comprises axially separated rings 12 connected by a number (e.g. four (4) as shown), of axially extending rungs 11. Each rung 11 11 meets with the respective ring 12 by way of a T-section 13.

Figure 3:
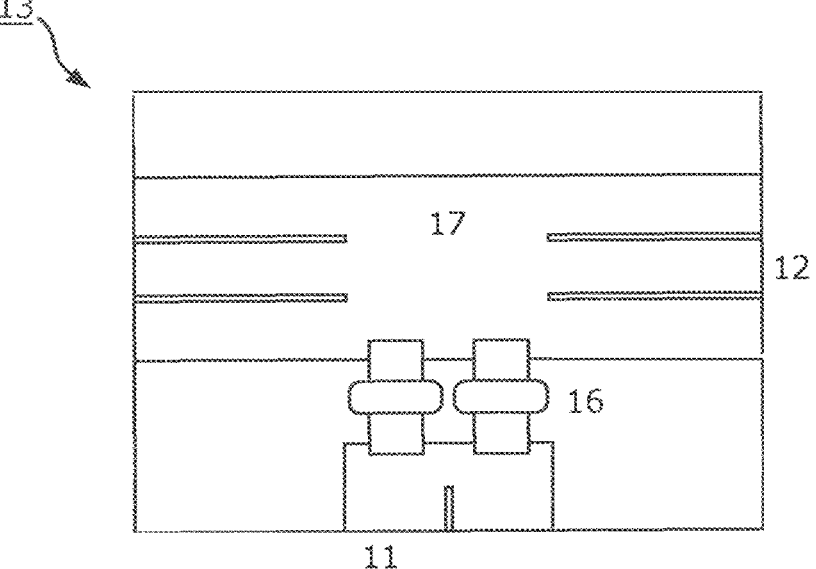
FIG. 3 shows a top view of a prior art single T-section with lumped capacitors.

FIG. 3 shows a top view of a prior art single T-section 13 with lumped capacitors 16. At the centre region large continuous copper area 17 is provided.

Figure 4:
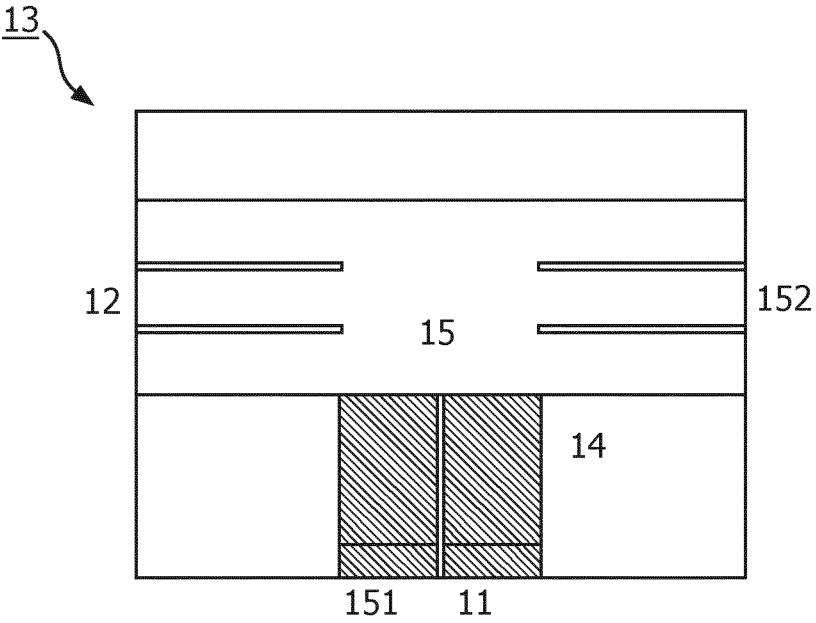
FIG. 4 shows a top view of a single T-section with a layered capacitor. Copper on the other side of the dielectric is drawn in a white pattern. Note the large continuous copper area at the centre of the T-section.

FIG. 4 shows a top view of an example of single T-section 13 of the invention with a layered capacitor 14. Copper on the other side of the dielectric is drawn in a hatched pattern 151. Note the large continuous electrically conducting metallic (e.g. copper) area at the centre of the T-section 13. Copper on the other side of the dielectric is drawn in a hatched pattern. Note the large continuous copper area at the centre of the T.

Figure 5:
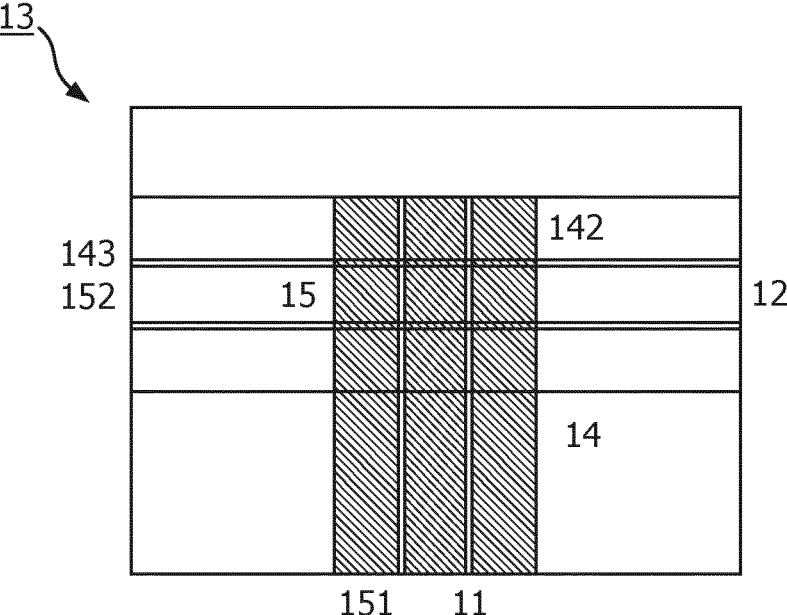
FIG. 5 shows a top view of the novel implementation of the T-section. Copper on the other side of the dielectric is drawn in white. Note the extension of one section to overlap the other entirely, and the slits extending all the way along the conductive sections.

FIG. 5 shows a top view of the novel implementation of the T-section 13. Metal such as Copper on the other side of the dielectric is drawn in a hatched pattern. Note the extension 142 of one section to overlap the other 143 entirely, and the slits 141, 152 extending all the way along the conductive sections 11,12. Copper on the other side of the dielectric is drawn hatched. Note the extension of one section to overlap the other entirely, and the slits 152 extending all the way along the conductive sections.

A time-varying magnetic flux through a closed conductive loop results in a current flowing through the loop. This so called eddy current generates heat in the conductive medium and generates a magnetic field of its own which counteracts the original field. Gradient coils generate such a time-varying magnetic field, and any conductive medium inside the gradient coil, such as the rungs 11 and rings 12 of a body coil, experiences these eddy currents. The resulting heat may present a risk to both patient and parts and the field disruption degrades the quality of the image. This effect is well understood and design heuristics proscribe existence of large conductive surfaces and loops inside the gradient field. Methods used are dividing large conductors with slits 152 into smaller parts and, if necessary, bridging gaps with capacitors. Due to their electromagnetic characteristics, these capacitors function as a gap at the lower frequencies of the typical gradient field variation but as connections at the much higher operational frequencies of the body coil.

Typically, this is the way eddy currents are dealt with in body coil rings 12 and rungs 11. However, this leaves the T-section 13, where the rung 11 meets the ring 12, unslitted, as changes in RF current direction make the proper placement of capacitors difficult. Partially slitted T-sections 13 for body coils with lumped and layered capacitors are shown in FIGS. 3 and 4 respectively. Attempts were made to change the size and shape of the T-section 13, some including the addition of discrete capacitors, with various degrees of success. In the latest generation of a body coils eddy currents in the body coil T-section 13 remain the chief cause of high inner bore temperatures.

Using advanced computational analysis methods, the T-section 13 layout of the invention effectively or even completely disconnects the ring 12 and rung 11 sections and divides the sections themselves in multiple smaller strips, minimizing the width of every conductive element. The rung 11 and ring 12 section are physically separated by a dielectric layer and only connect electrically through a layered capacitor. As both ring 12 and rung 11 sections are fully slitted along their length the overlapping sections form a large parallel circuit capacitor array. FIG. 5 shows an implementation of this novel T-section 13 concept.

The invention combines the functions of both tuning and bridging into this single layered capacitor array, without significantly inhibiting the natural RF current flow. In fact, the new layout offers the current multiple independent paths of similar impedance, spreading out the current across the conductor, limiting the proximity effect and lowering local RF heating in addition to lowering eddy current heating. Also, since the large impedance transitions are concentrated in the vertical plane and between the capacitor plates, there is less electric field fanning out towards the patient.

The invention specifically applies to a Quadrature Body Coil (QBC) using a Printed Circuit Board (PCB) for its patient oriented inner component, here termed the antenna.

The lesser dimension of any conductive surface on the QBC Antenna PCB should not exceed 20 mm. The antenna ring 12 sections should not have a conductive connection with the rung 11 sections where they meet (i.e. the T-section

13). The antenna rung 11 sections on one layer of the PCB should extend across the ring 12 section of the other layer of the PCB and thus form a network of parallel plate capacitors integrated in the PCB structure. (see FIG. 5).

The invention as described is meant to apply to a specific geometric feature of the antenna conductors, called the T-section 13, and meant to deal with a specific issue encountered in this T-section 13, i.e. the overheating of the T-section 13 due gradient coil induced eddy currents. However, as will be shown in the section on invention applications, the positive effects extend far past this single problem. Therefore, the application of some features can be, and have been applied to many other PCB structures used inside an MRI-scanner's bore, including QBC antennas and screens and other MRI coils. The unique aspect of this invention is the combination of both the segmentation of feature 2 with the overlap pattern of feature 4 to create complex patterns of distributed coupled capacitors. This allows a significant reduction of the size of the largest conductive surface, in this case the antenna's T-section 13.

As this problem solves a problem specific to QBC's using a layered PCB structure for antenna, alternatives to this invention use alternative structures that offer a small continuous surface parallel to the surface of the gradient coil, such as QBC's with a copper rod structures. For PCB antennas, alternative methods use the narrowing of the ring 12 width at the T-section 13 to reduce the surface area presented.

The primary applications of the invention are:

Reduction in gradient field induced eddy currents in the antenna's T-section 13, and therefore:

Lower gradient field induced heating of the antenna T-section 13 and thus lower inner bore heating.

Less eddy current induced field errors and associated anomalies such as EPI ghosting.

Consequently, as inner bore heating could limit applied gradient power, this invention expands the possibility of application of stronger gradient fields and shorter switching times.

The capacitor array connection between ring 12 and rung 11 effectively distributes RF currents across a wider surface, reducing the proximity effect.

This lowers peak surface currents, which lowers power losses and increases coil efficiency.

Consequently, local RF current induced heating on the T-section 13 will also be reduced by implementation of this concept.

The overlapping rung 11-ring 12 transition shields the patient more effectively from electric fields across the transition than more horizontally oriented transitions.

This reduces unwanted system interaction between the body coil and the patient such as body coil detuning and electric field induced patient SAR.

The concept uses standard layered PCB body coil concepts and could be applied to a redesign of most low pass and band pass implementations of existing layered PCB body coil designs.

The concept achieves its purpose without the need of additional lumped capacitors and associated increases in costs and reduction in reliability.

Another aspect of invention described concerns a new the RF screen 60 e.g. for use with the QBC of the invention.

RF screens, a.k.a shields, are an integral part of modern Quadrature Body Coils that shield the electromagnetic fields inside the QBC from components outside of the QBC. Without RF screens this coupling with the outside world reduces the quality and predictability of the symmetry, uniformity, and SNR of the QBC. The downside of the RF screen 60 is that its presence close to the field generating rungs 11 and rings 12 of the birdcage lowers their efficiency.

In its simplest form the RF screen to can comprise of a layer of copper or aluminium foil wrapped around the birdcage. However, during imaging, the high conductivity of this type of material would result in high eddy currents from switching gradient fields. To avoid this problem QBC RF screens are designed to have a high impedance in the kHz range of the gradient fields. One common method of achieving this is by using materials with low conductivity, like phosphor bronze or titanium, at sufficient thickness to maintain proper RF shielding. The same effect can be achieved with the use of a fine mesh made out of steal or bronze.

Another method is to segment the RF screen into smaller sections. RF conductivity is achieved between the sections by connecting them through capacitors. These capacitors can be implemented as lumped elements soldered between the sections, or by having sections overlap in a multi-layered panel thus forming integrated capacitors. The effect of eddy currents can be further reduced by elongating the path eddy currents have to take to enclose a certain area of conductive material. This is achieved by adding even more (partial) slitting to the remaining segments, without dividing them up even further. Currents flowing across a surface generate a magnetic field on their own, which counteracts the original currents, severely increasing resistance near the centre of the sheet. This forces the currents to mostly flow near the edge of the sheet. This is called the proximity effect.

The size of the electromotive force is proportional to the size of the conductive surface, while the size of the resulting current is determined by the resistance of the path around the surface. Therefore given the same area, reducing the total circumference reduces eddy currents. Thus segmentation (a.k.a lamination in transformer cores) and slitting reduces eddy currents.

Segmentation of RF screens was limited by the understanding that a free flow of RF currents required a large capacitance to exist between segments. Single layer RF screen therefore have of a large number of surface mounted capacitors installed which increases costs, production time and a lowers quality. Furthermore, lumped capacitors function as choke points for RF currents, altering their natural course and thus reducing the effectiveness of the RF screen. For the case of multi-layered screens with integrated capacitors the size of the overlap between segment panels determined the total capacitance between them and it was determined that the required size of the capacitors required so much overlap that the number of total segments was severely limited.

The proposed aspect of the invention applies a radical level of segmentation to a multi-layer RF screen 60, creating a large mesh of smaller coupled capacitors. Through the use of modern computational electromagnetics software it was determined that the large network of smaller capacitances allowed sufficient uninhibited flow of RF currents for the screen to function adequately as an RF screen. Because an even distribution of impedance across the screen it functions in fact better than conventionally slitted screens it was compared to.

Thus, this aspect of the invention significantly reduces the level of eddy currents and therefore gradient coil induced heat generation compared to older designs while providing an overall better RF performance. This allows the application of higher gradient fields than was possible with previously known body coil designs.

Figure 6:
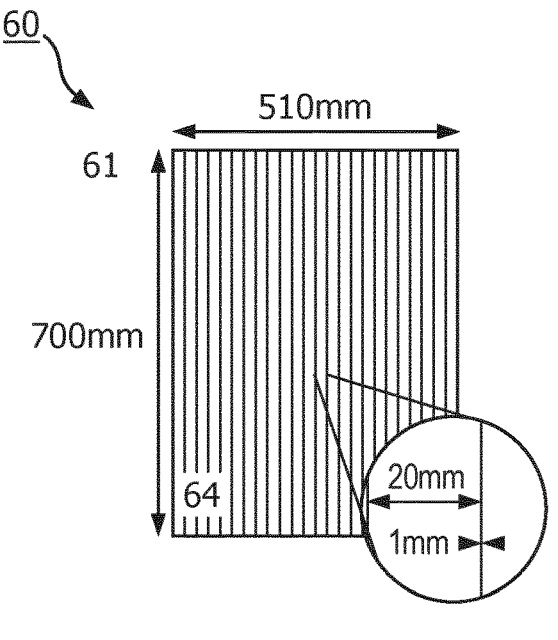
FIG. 6 shows a PCB layout of the inner side of the RF screen of the invention.
Figure 7:
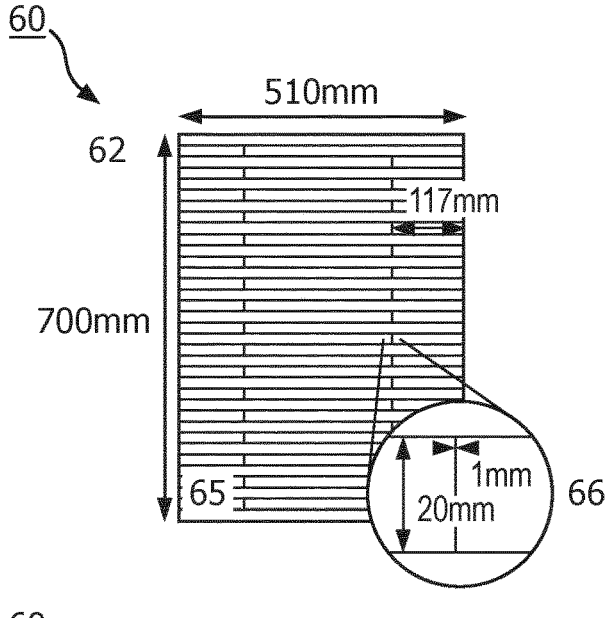
FIG. 7 shows a PCB Layout outer side of the RF screen of the invention.
Figure 8:
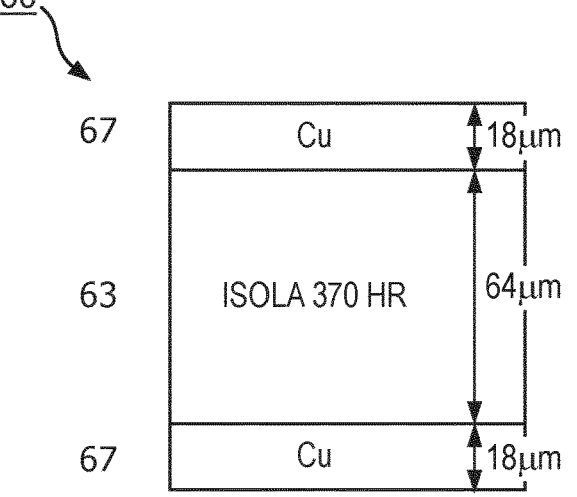
FIG. 8 shows a PCB stack up of the RF screen of the invention.

FIG. 6 shows a PCB layout of the inner side of the RF screen of the invention;

FIG. 7 shows a PCB Layout outer side of the RF screen of the invention;

FIG. 8 shows a PCB stack up of the RF screen of the invention;

This implementation of the invention comprises of a laminate PCB cylinder 60, optionally divided in a number of smaller sub panels, with at least two conductive layers 64,65 radially spaced at a distance such that, in combination with the choice of dielectric material 65, a specific capacitance per unit area exists between the conductive layers 64,65.

One conductor layer is divided into segments 64 of equal width along the circumference of the cylinder with the other dimension of the segment stretching along the entire length of the cylinder, a.k.a strips.

The other conductor layer is divided into segments 65 of equal width along the length of the cylinder with the other dimension of the segment stretching along the entire circumference of the cylinder, a.k.a. hoops.

The distance between these segments, i.e. the part of the conductor that is removed, is kept at a minimum.

Thus is created a checkerboard pattern 66 of overlapping slits 64,65 and hoops forming a large cylindrical network of layered capacitors.

Continuous hoops 65 along the entire circumference of the screen may capture switching gradient fields perpendicular to the transverse plane of the scanner bore, e.g. fields generated by the z-gradient. Hoops should therefore be slitted at least once more to break the hoop. It is advisably to apply this slit in the middle of a strip, so two smaller capacitors are formed and a continuous RF path remains along the entire hoop.

It was determined through numerical analysis that the width of the strips and hoops should be no larger than 20 mm and the slits 64,65 between them no larger than 1 mm. The resulting design has 32 hoops and 96 strips for a total of 3072 capacitors.

The previously held assumption that the smaller capacitors would not allow a sufficiently free and effective flow of RF currents proved to be unwarranted. It was found that, although the capacitance of a single element was small, the network of inductively and capacitive coupled segments 66 resulted in an impedance at RF frequencies comparable to that found in previous screen designs.

In summary the minimum list of features of this invention is as follows:

Two concentric cylindrical tubes of conductive material interspaced with a dielectric, surrounding a RF coil.

One conductive layer segmented into a minimum of two strips 64.

The other conductive layer segmented into a minimum of two hoops 65.

The smallest dimension of the surface of a segment should not be larger than 20 mm.

Strips and hoops overlap in a checkerboard pattern forming a network of coupled capacitors.

NB: The value of the width of the segments is entirely dependent on the required level of eddy current suppression. If the requirement of a minimum width is left out the invention is very close to the last generation of layered screens, which are segmented into strips but not hoops.

The PCBs comprises of two layers 67 of 18 μm thick copper separated by 64 μm of ISOLA 370 HR dielectric material 63. The innermost copper layer, i.e. the layer directed towards the inside of the bore, is segmented into 24 parallel copper strips, 20 mm wide and 700 mm long, separated by 1 mm wide gaps (slits 152). The outermost copper layer, i.e. the layer directed towards the gradient coil, is segmented into 32 parallel copper pieces that, when connected at the edges of the PCB, form hoops surrounding the bore. These hoop segments are 20 mm wide and 510 mm long, separated by 1 mm wide gaps (slits 152). To avoid the creation of large continuous hoops each hoop segment itself is divided into two segments with a 1 mm wide slit positioned 117 mm from alternatingly the left and right side of the plate.

RF Model Results from ANSYS HFSS showing normalized magnetic and electric field distributions on the coronal plane for a perfect electrical conductor screen (left) and the prototype screen (right). Note the similarity in both field distributions and especially the lack of significant electric fields extending from the side of the screen.

The four panels are wrapped around a body coil carrier containing a birdcage coil antenna and the hoop segments are galvanically connected.

RF simulations and measurements show the proper functionality of the novel RF screen.

Figure 9:
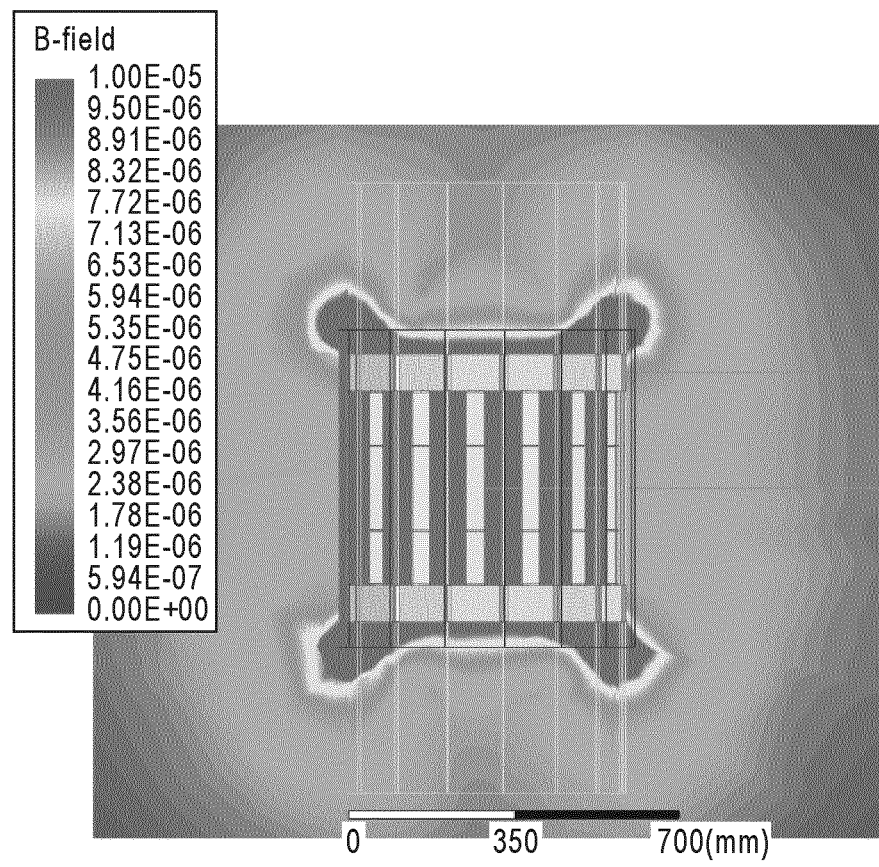
FIG. 9 is a graphical representation of the coronal magnetic field for an ideal RF screen
Figure 10:
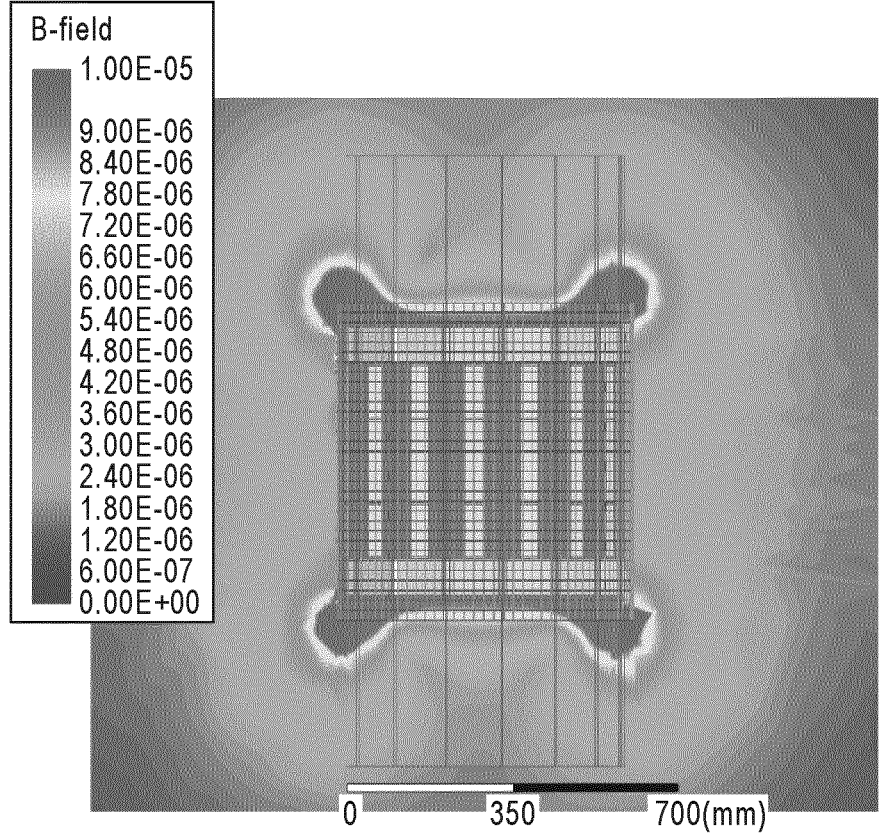
FIG. 10: is a graphical representation of the coronal magnetic field for an RF screen of the invention.
Figure 11:
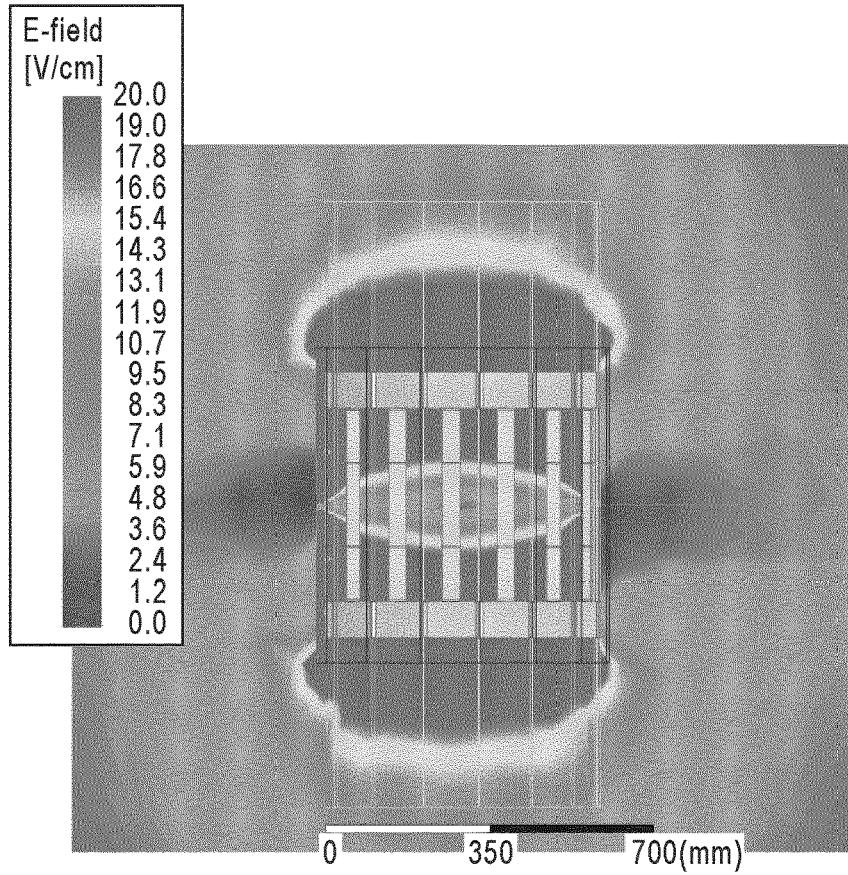
FIG. 11: is a graphical representation of Coronal electric field an ideal RF screen.
Figure 12:
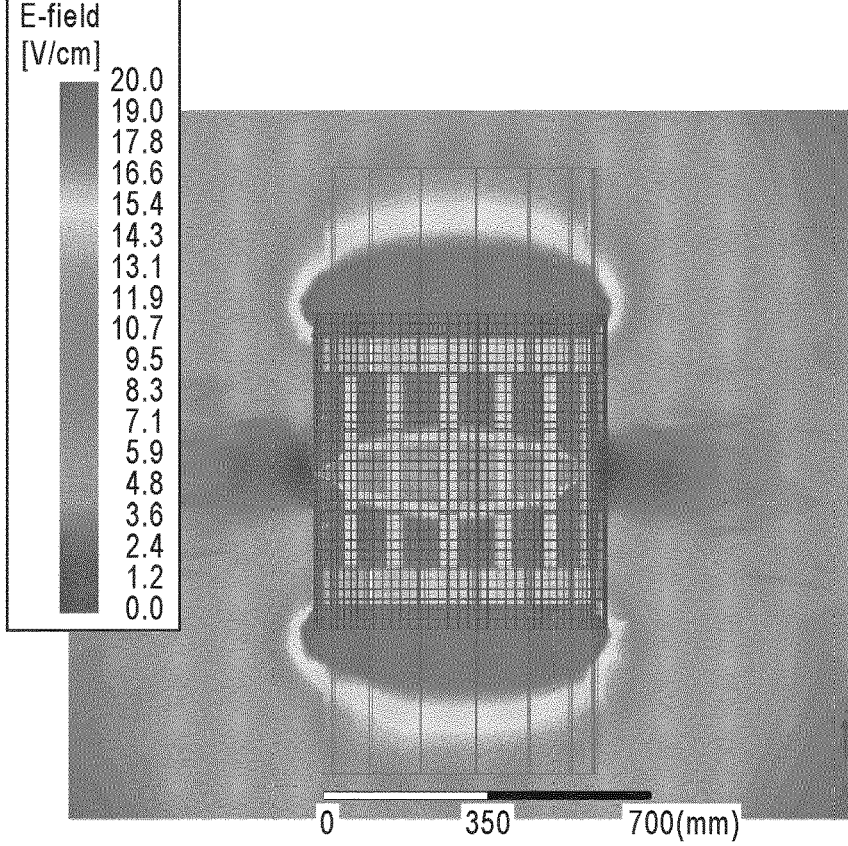
FIG. 12: is a graphical representation of Coronal electric field, RF-screen an RF screen of the invention

FIG. 9 is a graphical representation of the coronal magnetic field for an ideal RF screen FIG. 10: is a graphical representation of the coronal magnetic field for an RF screen of the invention;

FIG. 11: is a graphical representation of a coronal electric field an ideal RF screen;

FIG. 12: is a graphical representation of Coronal electric field, RF-screen an RF screen of the invention. That is, FIGS. 9-12 are electromagnetic model calculations showing distribution of the normalized magnetic and electric fields in the body coil's coronal plane for a perfect screen and the novel screen design. The calculations shows no significant difference in field strength and distribution between the novel screen design and the perfect screen. Of special note is the lack of significant electric fields extending from middle of the screens, indicating system interaction is unlikely to be significantly larger than a perfect screen. To confirm this excellent system isolation the QBC was inserted into a gradient coil with a continuous copper screen and the novel RF screen. The difference in main mode frequency shift due to GC system interaction was negligible between the perfect screen and the novel RF screen (369 kHz vs 332 kHz) as was the reduction in body coil quality factor (−20 vs −21).

Figure 13:
FIG. 13 represents a stream calculation of absorbed Power Density [kW/m3] due to gradient induced eddy currents for a conventional RF Screen (top) and the RF-screen of the invention. Note the significant reduction of absorbed power, specifically for the X-gradient.

FIG. 13 represents a stream calculation of absorbed Power Density [kW/m3] due to gradient induced eddy currents for a conventional RF Screen (top) and the RF-screen of the invention. Note the significant reduction of absorbed power, specifically for the X-gradient.

The Stream calculation algorithm was used to calculate the gradient coil induced eddy current power density on the RF screen panels for both the novel RF screen and the RF Screen 3T M2. The outcomes, displayed in Fig., showed a predicted reduction in absorbed power by a factor of 3.3 for the x and y-gradients and 3.9 for the z-gradients as well as a reduction in expected peak power by a factor of 42.1.

Thermal probe measurements of the novel RF screen confirm the panels stay well within temperature requirements for maximum system performance (<60° C. steady state for Grms=31.25 mT/m, freq=1.6 kHz+2×16 kW RF power).

Alternative embodiments of the invention could be in the application of the checkerboard network of laminated capacitors to screens of other RF Coils, like head coils, posterior coils or anterior coils. Furthermore the checkerboard pattern could be applied to other sensitive subsystems that require screening.

The primary applications of the invention are:

Reduction in gradient field induced eddy currents in the RF Screens, and therefore:

Lower gradient field induced heating of the RF Screen and thus lower inner bore heating.

Less eddy current induced field errors and associated anomalies such as EPI ghosting.

Consequently, as inner bore heating could limit applied gradient power, this invention expands the possibility of application of stronger gradient fields and shorter switching times.

The concept achieves its purpose without the need of additional lumped capacitors and associated increases in costs and reduction in reliability.

The uniform and symmetric layout of the screen makes it implementation broadly applicable to most body coil designs as a wide range of other applications requiring RF screening with low gradient sensitivity.

The invention claimed is:

1. A radio frequency (RF) shield comprising:
two concentric cylindrical tubes each of a conductive layers interspaced with a dielectric;
a first conductive layer segmented into a set of two or more longitudinal strips;
a second conductive layer segmented into a set of two or more circumferential hoops, wherein: a large mesh of smaller coupled capacitors exists in the segmented first and second conductive layers; and sets of longitudinal strips and circumferential hoops cross to form overlapping areas of a network of smaller capacitances to cause sufficient uninhibited flow of RF currents for the shield to function as an RF shield.

2. The RF shield of claim 1, wherein a checkerboard pattern of overlapping slits and hoops form a large cylindrical network of layered capacitors.

3. The RF shield of claim 2, wherein a width of a segments of each of the two or more circumferential hoops and the two or more longitudinal strops no larger than 20 mm, and the width of the overlapping slits is not larger than 1 mm.

4. The RF shield of claim 2, wherein each hoop is divided into at least two segments with at least one slit.

5. The RF shield of claim 2, further comprising a radio frequency (RF) coil comprising a lay-out of electrical conductors, the RF coil comprising: several axial rungs and several circumferential rings, in which at least one of the rungs is coupled with at least one of the rings by a T-shaped connector, which comprises: a distributed capacitive coupling between the ring and the rung, the rung and the ring comprising respective sets of overlapping axial and circumferential electrical conducting segments that form the T-shaped conductor and that are galvanically insulated from one another and the distributed capacitive coupling formed by the overlapping regions of the sets of electrical conducting segments.

6. The RF shield of claim 5, wherein the axial set and the circumferential set include a plurality of elongate electrical conductors that are orientated in the circumferential and axial directions, respectively.

7. The RF shield of claim 5, wherein the T-shaped connector has a printed-circuit board substrate and the axial and circumferential electrical conducting segments are disposed on opposite surfaces of the printed-circuit board substrate.

8. The RF shield of claim 5, wherein the axial and circumferential electrical conducting segments are sets of respective slitted flat elongate conductor strips orientated in the circumferential and axial directions, respectively.

9. The RF shield of claim 5, wherein the sets of axial and circumferential electrical conducting segments are integral with the ring and rung, respectively forming the T-shaped connector.

10. The RF shield of claim 5, comprising a plurality of circumferential rings and axial rung, wherein pairs of the rungs and the rings have respective sets of overlapping axial and circumferential electrical conducting segments that form the T-shaped conductor coupling the ring and rung of the pair and that are galvanically insulated from one another and the distributed capacitive coupling formed by the over-lapping region of the sets of electrical conducting segments.

11. The RF shield of claim 5, wherein the ring and rung comprise sections that are fully slitted along their respective lengths.

12. The RF shield of claim 11, wherein overlapping sections of the ring and the rung form a parallel capacitor array circuit.

13. The RF shield of claim 5, wherein the overlapping regions of the sets of extensions overlap each other entirely.

\* \* \* \* \*